United States Patent
Kim et al.

(10) Patent No.: US 7,847,348 B2
(45) Date of Patent: Dec. 7, 2010

(54) SEMICONDUCTOR APPARATUS

(75) Inventors: Won-joo Kim, Hwaseong-si (KR);
Sang-moo Choi, Yongin-si (KR);
Tae-hee Lee, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 0 days.

(21) Appl. No.: 12/382,281

(22) Filed: Mar. 12, 2009

(65) Prior Publication Data
US 2009/0230442 A1 Sep. 17, 2009

(30) Foreign Application Priority Data
Mar. 14, 2008 (KR) ........................ 10-2008-0023934

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................... 257/337; 257/347; 257/395; 438/303; 438/304

(58) Field of Classification Search ................. 257/337, 257/347, 395, 408; 438/303, 304, 306
See application file for complete search history.

(56) References Cited

U.S. PATENT DOCUMENTS

| 5,869,378 | A | 2/1999 | Michael | |
|---|---|---|---|---|
| 6,621,123 | B1* | 9/2003 | Nakabayashi et al. | 257/347 |
| 7,122,850 | B2* | 10/2006 | Nam et al. | 257/295 |
| 2003/0038308 | A1* | 2/2003 | Kim | 257/288 |
| 2004/0038485 | A1* | 2/2004 | Pong et al. | 438/286 |

FOREIGN PATENT DOCUMENTS

| JP | 04-116846 | 4/1992 |
|---|---|---|
| JP | 05-121436 | 5/1993 |
| KR | 10-2006-0069588 | 6/2006 |

* cited by examiner

*Primary Examiner*—Phuc T Dang
(74) *Attorney, Agent, or Firm*—Harness, Dickey & Pierce, P.L.C.

(57) ABSTRACT

Provided is a semiconductor apparatus including a substrate region, an active region on the substrate region, a gate pattern on the active region, and first and second impurities-doped regions along both edges of the active region that do not overlap the gate pattern. The length of the first and second impurities-doped regions in the horizontal direction may be shorter than in the vertical direction. The first and second impurities-doped regions may be formed to be narrow along both edges of the active region so as not to overlap the gate pattern.

18 Claims, 6 Drawing Sheets

SEMICONDUCTOR APPARATUS

PRIORITY STATEMENT

This application claims priority under U.S.C. §119 to Korean Patent Application No. 10-2008-0023934, filed on Mar. 14, 2008, in the Korean Intellectual Property Office (KIPO), the entire contents of which are incorporated herein by reference.

BACKGROUND

1. Field

Example embodiments relate to a semiconductor apparatus and a method of fabricating the same, and more particularly, to a semiconductor apparatus in which impurities-doped regions may be formed along both edges of an active region, and a method of fabricating the same.

2. Description of the Related Art

1-T DRAMs consisting of one transistor without a capacitor have recently been used. The 1-T DRAMs are not only relatively simple to manufacture but have an improved sensing margin.

SUMMARY

Example embodiments provide a semiconductor apparatus, in which impurities-doped regions may be formed along both edges of an active region and the length of the impurities-doped regions in the horizontal direction is shorter than the length thereof in the vertical direction, and a method of fabricating the same.

According to example embodiments, a semiconductor apparatus may include a substrate region; an active region on the substrate region; a gate pattern on the active region; and first and second impurities-doped regions along both edges of the active region that do not overlap the gate pattern.

The lengths of the first and second impurities-doped regions in the horizontal direction may be shorter than in the vertical direction. The first and second impurities-doped regions may increase in width from top to bottom. In the first and second impurities-doped regions, the density of impurities may be the same in the vertical direction or a ratio of a maximum density of impurities to a minimum density of impurities in the vertical direction may be less than or equal to about 10:1. The distance between the first and second impurities-doped regions may be equal to or greater than about 2.0 F. The semiconductor apparatus may be one of a single gate structure, a double gate structure, a triple gate structure, and a recessed gate structure. The semiconductor apparatus may further include an insulation region between the substrate region and the active region and first and second impurities-doped regions; and an inter-layer dielectric (ILD) layer surrounding the gate pattern.

According to example embodiments, a semiconductor apparatus may include a substrate region; an active region on the substrate region; and first and second impurities-doped regions along both edges of the active region, wherein the first and second impurities-doped regions are narrow along both of the edges of the active region and the length of the first and second impurities-doped regions in the horizontal direction may be shorter than in the vertical direction.

The semiconductor apparatus may further include an insulation region between the substrate region and the active region and first and second impurities-doped regions; a gate pattern on the active region; and an inter-layer dielectric (ILD) layer surrounding the gate pattern. The first and second impurities-doped regions may not overlap the gate pattern. The semiconductor apparatus may further include a gate region having one of a single gate structure, a double gate structure, a triple gate structure, and a recessed gate structure. The first and second impurities-doped regions may increase in width from top to bottom.

According to example embodiments, a semiconductor apparatus may include a substrate region; a plurality of active regions on the substrate region, where the active regions are spaced a given distance from each other; a plurality of first impurities-doped regions and a plurality of second impurities-doped regions being respectively formed along both edges of the active regions, wherein the first and second impurities-doped regions may be formed to be narrow along both the edges of the active regions, and the length of the first and second impurities-doped regions in the horizontal direction is shorter than in the vertical direction.

The semiconductor apparatus may further include a plurality of gate patterns being respectively formed on the active regions, where the length of the gate patterns in the horizontal direction is shorter than the length of the active regions in the horizontal direction. The semiconductor apparatus may further include an insulation region between the substrate region and the plurality of active regions and the plurality of the first and second impurities-doped regions; and a plurality of inter-layer dielectric (ILD) layers surrounding the plurality of gate patterns. The plurality of the first and second impurities-doped regions may not overlap the plurality of gate patterns. The semiconductor apparatus may be one of a single gate structure, a double gate structure, a triple gate structure, and a recessed gate structure. The plurality of first and second impurities-doped regions may increase in width from top to bottom.

BRIEF DESCRIPTION OF THE DRAWINGS

Example embodiments will be more clearly understood from the following detailed description taken in conjunction with the accompanying drawings. FIGS. 1A-1B and 2-9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described in greater detail with reference to the accompanying drawings. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

Figure 1A:
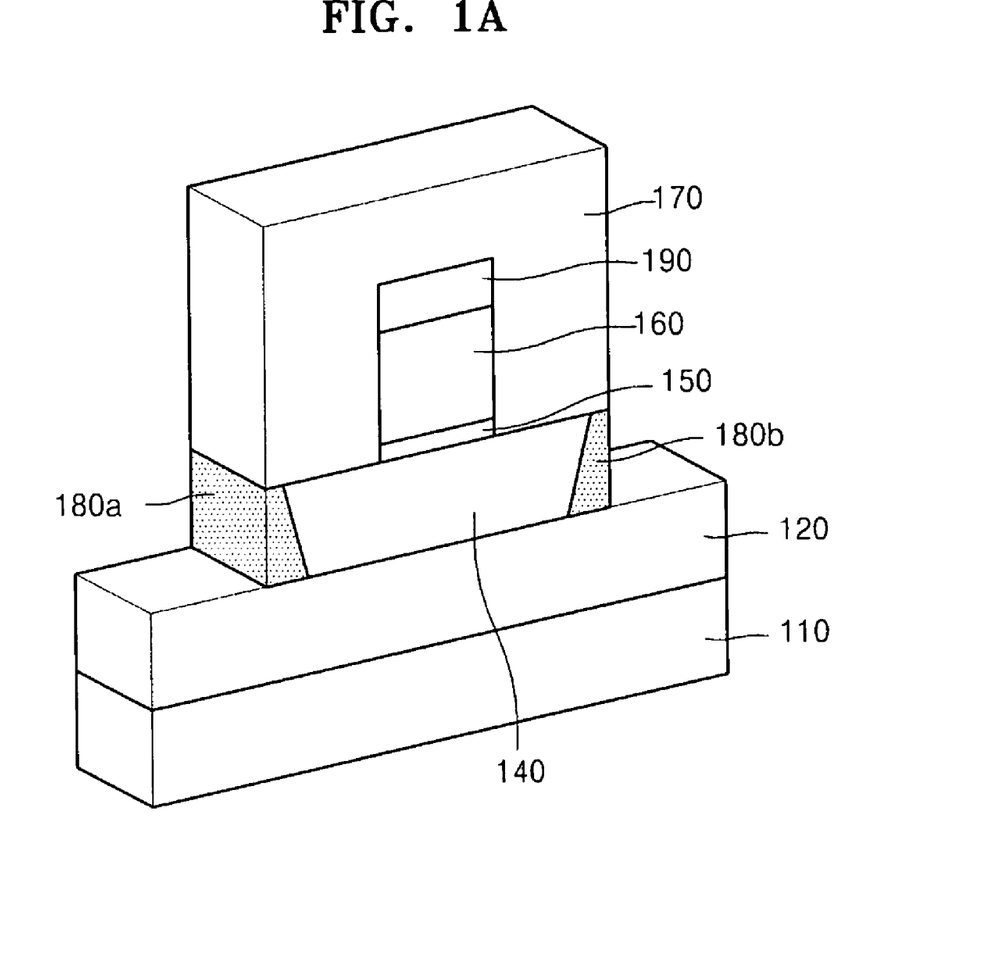
FIGS. 1A and 1B are perspective views of a semiconductor apparatus according to example embodiments.
Figure 1B:
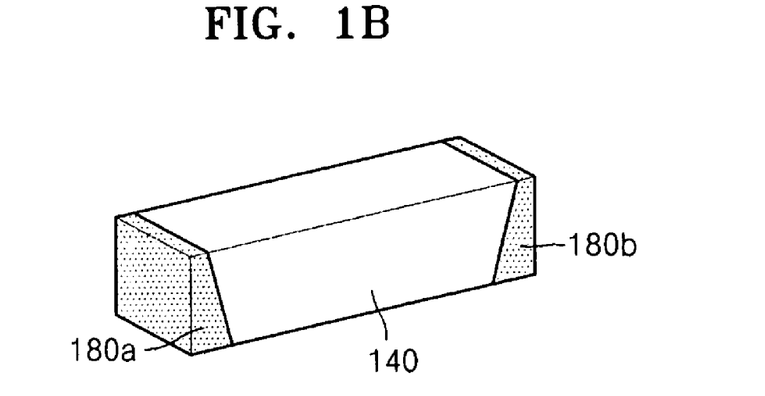

FIGS. 1A and 1B are perspective views of a semiconductor apparatus according to example embodiments. Referring to FIG. 1A, the semiconductor apparatus may include a substrate region 110, an active region 140, a gate pattern 160, a first impurities-doped region 180a, and a second impurities-doped region 180b. The semiconductor apparatus according to example embodiments may further include an insulating region 120 on a substrate region 110 and an inter-layer dielectric (ILD) layer 170.

The active region 140 may be disposed on the substrate region 110 and the gate pattern 160 may be disposed in the active region 140. The first and second impurities-doped regions 180a and 180b may be formed along both edges of the active region 140. That is, the first impurities-doped region 180a may be formed along the left edge of the active region 140 and the second impurities-doped region 180b may be formed along the right edge of the active region 140. For example, referring to FIG. 1B, the first and second impurities-doped regions 180a and 180b may be manufactured in the form of a wall along both the edges of the active region 140.

The first impurities-doped region 180a may be formed to cover parts of the upper and front surfaces of and the entire left side surface of the active region 140 along the left edge of the active region 140. The second impurities-doped region 180b may be formed to cover parts of the upper and front surfaces of and the entire right side surface of the active region 140 along the right edge of the active region 140.

The first and second impurities-doped regions 180a and 180b may be formed to be narrow along the edges of the active region 140 and not overlap the gate pattern 160. The length of the first and second impurities-doped regions 180a and 180b in the horizontal direction may be shorter than the length thereof in the vertical direction. Because the first impurities-doped region 180a is formed along the left edge of the active region 140, the length of the first impurities-doped region 180a in the vertical direction may be substantially the same as that of the active region 140 in the vertical direction, but the length of the first impurities-doped region 180a in the horizontal direction may be shorter than the length of the first impurities-doped region 180a or the active region 140 in the vertical direction.

As described above, because the first and second impurities-doped regions 180a and 180b are formed to be narrow along the edges of the active region 140, the distance between the first impurities-doped region 180a and the second impurities-doped region 180b may be increased even if the length of the active region 140 is not increased in the horizontal direction. For example, the distance between the first and second impurities-doped regions 180a and 180b may be equal to or greater than about 2.0 F. Because the distance between the first and second impurities-doped regions 180a and 180b is increased, channel breakdown may not occur in the active region 140 between the first and second impurities-doped regions 180a and 180b.

Also, because the first and second impurities-doped regions 180a and 180b are formed to be narrow along the edges of the active region 140, the distance between the gate pattern 160 and the first impurities-doped region 180a, and the distance between the gate pattern 160 and the second impurities-doped region 180b, may increase. Thus, occurrence of band-to-band tunneling (BTBT) may be reduced.

The density of impurities in the first and second impurities-doped regions 180a and 180b of the semiconductor apparatus of FIG. 1 according to example embodiments may be the same in the vertical direction. The ratio of a maximum density of impurities to a minimum density of impurities in the vertical direction may be less than or equal to about 10:1. As described above, impurities may be relatively evenly doped in the first and second impurities-doped regions 180a and 180b in the vertical direction.

Compared with any other semiconductor apparatus in which first and second impurities-doped regions are not formed along both edges of an active region and a length of the first and second impurities-doped regions in a horizontal direction is greater than a length thereof in a vertical direction, the distance between the first and second impurities-doped regions 180a and 180b in the semiconductor apparatus of FIG. 1 is longer. Accordingly, channel breakdown is less likely to occur in the first and second impurities-doped regions 180a and 180b in the semiconductor apparatus of FIG. 1.

Also, the length of the active region 140 in the horizontal direction need not be increased to increase the distance between the first and second impurities-doped regions 180a and 180b of FIG. 1, and thus the size of the semiconductor apparatus of FIG. 1 can be decreased.

The first and second impurities-doped regions 180a and 180b may taper from top to bottom. That is, the length of the top of the first and second impurities-doped regions 180a and 180b may be shorter than the length of the bottom thereof. The first and second impurities-doped regions 180a and 180b may be variously shaped as will be described with reference to FIGS. 2 to 4.

Gate dielectric 150 and insulator 190 are general elements in the field of semiconductor apparatuses, and thus, their detailed descriptions will be omitted. The structure of the gate dielectric 150 in FIGS. 1, 2, 3, and 4 is the same with the structure of gate dielectrics 650_1 and 650_2 in FIGS. 5 and 6, gate dielectric 962 in FIG. 8, and gate dielectric 1050 in FIG. 9. Also, the structure of the insulator 190 in FIGS. 1, 2, 3, and 4 is the same with the structures of insulators 690_1 and 690_2 in FIGS. 5 and 6, and insulator 1090 FIG. 9.

Figure 2:
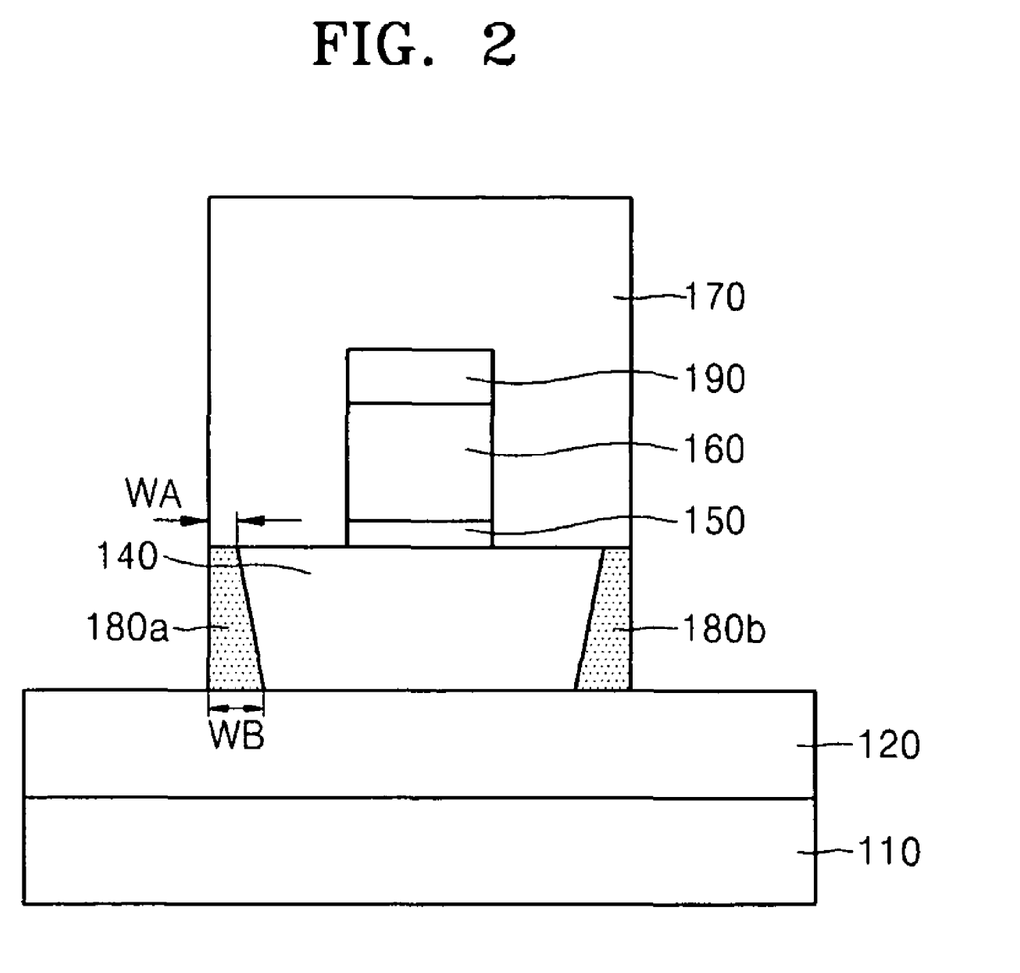
FIG. 2 is a front view of the semiconductor apparatus of FIG. 1.
Figure 3:
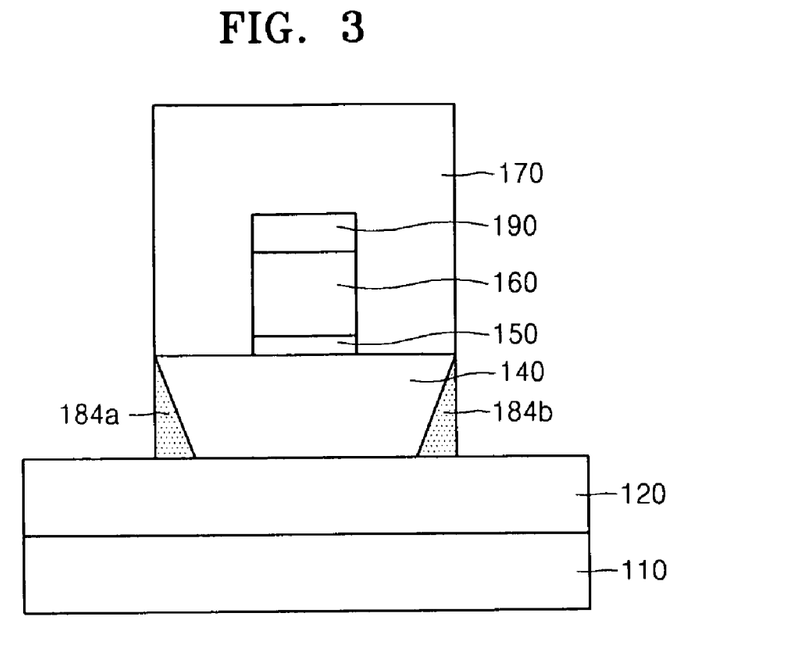
FIG. 3 is a front view of a semiconductor apparatus according to example embodiments.

FIG. 2 is a front view of the semiconductor apparatus of FIG. 1. FIG. 3 is a front view of a semiconductor apparatus according to example embodiments. Referring to FIG. 2, the first and second impurities-doped regions 180a and 180b may be formed in a triangular shape. FIG. 2 illustrates that the length WA of a rectangular top surface of the first and second impurities-doped regions 180a and 180b is shorter than the length WB of a rectangular bottom surface thereof in the horizontal direction. Referring to FIG. 3, the first and second impurities-doped regions 184a and 184b may be formed in a triangular shape. That is, the first and second impurities-doped regions 184a and 184b may taper from top to bottom.

Figure 4:
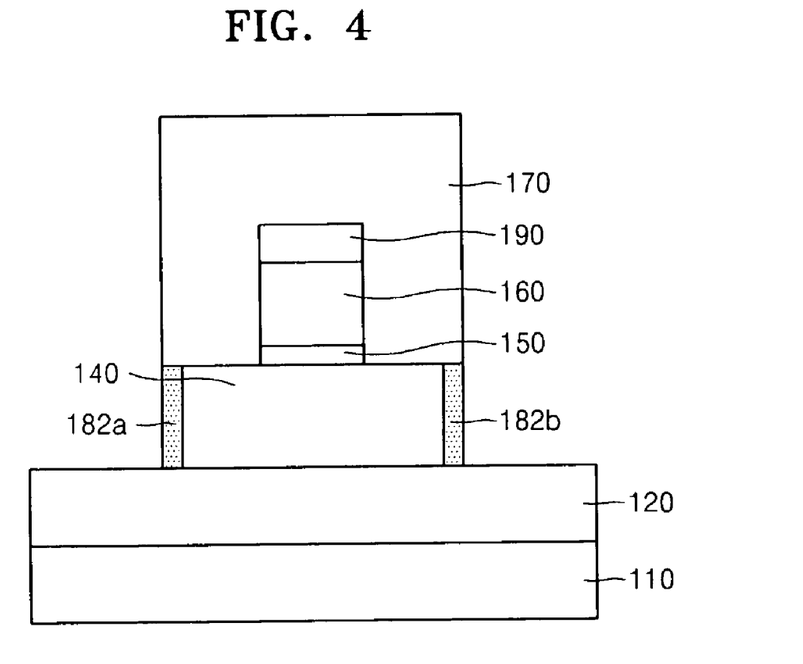
FIG. 4 is a front view of a semiconductor apparatus according to example embodiments.

FIG. 4 is a front view of a semiconductor apparatus according to example embodiments. Referring to FIG. 4, the length of first and second impurities-doped regions 182a and 182b may be equal to each other in the horizontal direction. That is, the length of the first and second impurities-doped regions 182a and 182b may be the same from top to bottom.

Referring to FIGS. 1A, 2, 3 and 4, the semiconductor apparatus according to example embodiments may further include an insulating region 120 on a substrate region 110. The insulating region 120 may be a buried oxide (BOX) region. The BOX region may be obtained by forming the insulating region 120 on the substrate region 110 made of a bulk substrate, or an insulating region of a silicon-oxide-insulator (SOI) substrate may be used as the BOX region. The insulating region 120 may be formed of a material containing oxide but is not limited thereto and may be formed of another insulating material. Alternatively, in the semiconductor apparatus according to example embodiments, the active region 140 may be directly formed on the substrate region 110 without the insulating region 120.

Referring to FIGS. 1A, 2, 3 and 4, the semiconductor apparatus according to example embodiments may further include an inter-layer dielectric (ILD) layer 170. The ILD layer 170 may be deposited around or surrounding a gate pattern 160. Alternatively, the ILD layer 170 may be omitted. Referring to FIGS. 1A, 2, 3 and 4, the first impurities-doped regions 180a, 182a, and 184a may be connected to a source line (not shown) and the second impurities-doped regions 180b, 182b and 184b may be connected to a bit line (not shown), and vice versa.

The semiconductor apparatus illustrated in FIGS. 1A, 2, 3 and 4 may function as bipolar junction transistors (BJTs). The gate pattern 160 may be a base region of a BJT, the first impurities-doped regions 180a, 182a, and 184a may be emitter regions of the BJT, and the second impurities-doped regions 180b, 182b, and 184b may be source regions of the BJT.

As illustrated in FIGS. 1A, 2, 3 and 4, the semiconductor apparatus according to example embodiments may include a gate pattern 160 but also may not include the gate pattern. Alternatively, another pattern may be formed on the active region 140, the first impurities-doped regions 180a, 182a, and 184a and the second impurities-doped regions 180b, 182b, and 184b instead of the gate pattern 160, thereby fabricating various-types of semiconductor apparatuses.

Figure 5:
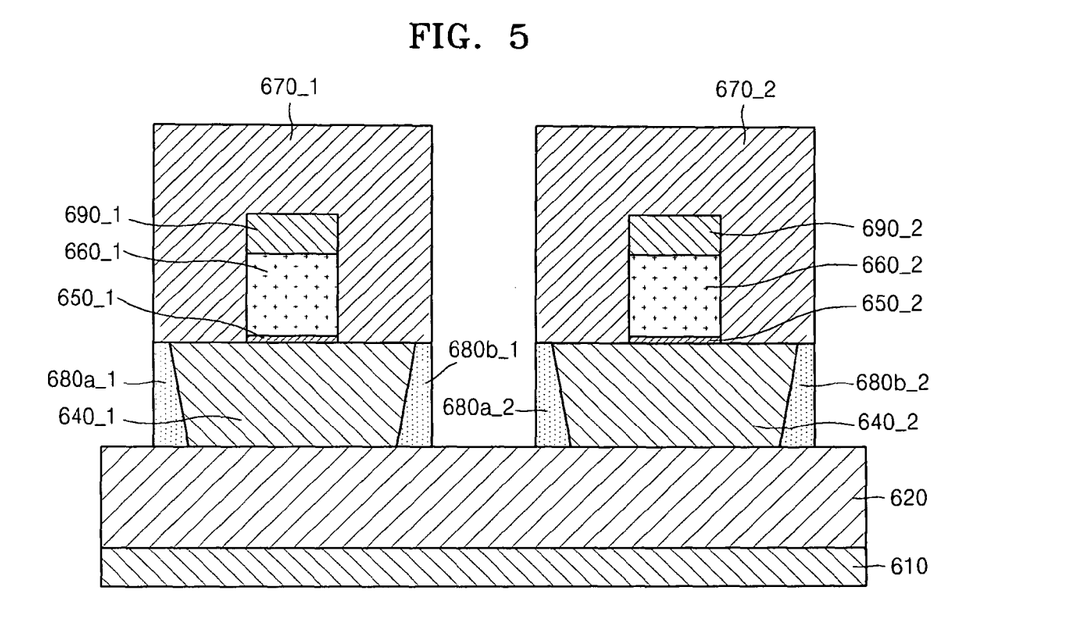
FIG. 5 illustrates that two semiconductor apparatus such as shown in FIG. 1 are formed on a substrate region according to example embodiments.

FIG. 5 illustrates two semiconductor apparatuses, e.g., as shown in FIG. 1, formed on a substrate region 610 according to example embodiments. Referring to FIG. 5, first and second active regions 640_1 and 640_2 may be formed on the substrate region 610. The first and second active regions 640_1 and 640_2 may be spaced a predetermined or given distance from each other. Also, two first impurities-doped regions 680a_1 and 680a_2 may be formed along edges of the first active region 640_1, and two second impurities-doped regions 680b_1 and 680b_2 may be formed along edges of the second active region 640_2. Similar to FIG. 1, the first impurities-doped regions 680a_1 and 680a_2 and the second impurities-doped regions 680b_1 and 680b_2 may be formed to be narrow along the edges of the first and second active regions 640_1 and 640_2, and the lengths of the first impurities-doped regions 680a_1 and 680a_2 and the second impurities-doped regions 680b_1 and 680b_2 in the horizontal direction may be shorter than in the vertical direction. Also, as illustrated in FIG. 1, an insulating region 620 may further be formed on the substrate region 610, and first and second ILD layers 670_1, 670_2 may be further respectively deposited around first and second gate patterns 660_1 and 660_2.

The elements illustrated in FIG. 5 respectively correspond to those illustrated in FIG. 1, and thus, a detailed description thereof will not be provided here. Although FIG. 5 illustrates that the first and second active regions 640_1 and 640_2 are formed on the substrate region 610, the total number of active regions is not limited to two. For example, a plurality of active regions may be aligned in the substrate region 610 in the form of array.

Figure 6:
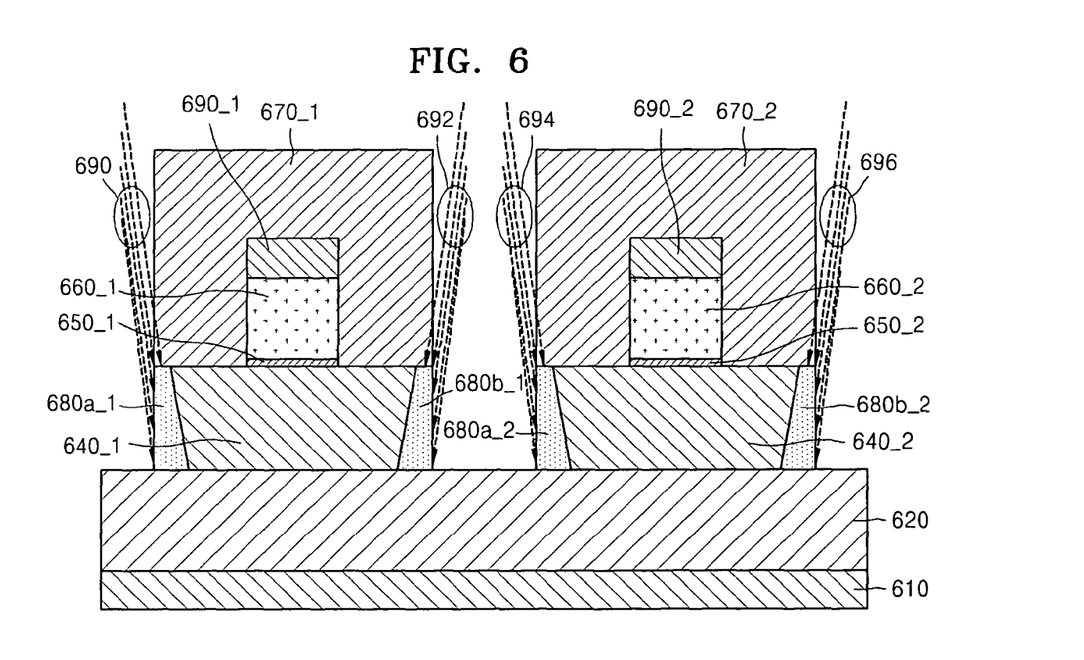
FIG. 6 is a cross-sectional view of a method of fabricating the semiconductor apparatus of FIG. 5 according to example embodiments.

FIG. 6 is a cross-sectional view of a method of fabricating the semiconductor apparatus of FIG. 5 according to example embodiments. The first and second active regions 640_1 and 640_2 may be formed on the substrate region 610, and the first and second gate patterns 660_1 and 660_2 may be formed on the first and second active regions 640_1 and 640_2. The first and second ILD layer 670_1 and 670_2 may be deposited around the first and second gate patterns 660_1 and 660_2. The first and second ILD layers 670_1 and 670_2 may encompass the first and second gate patterns 660_1 and 660_2. Both sides of the first and second ILD layers 670_1 and 670_2 may be patterned with respect to the first and second gate patterns 660_1 and 660_2. The first and second ILD layers 670_1 and 670_2 may be patterned so that the length of the first and second ILD layers 670_1 and 670_2 in the horizontal direction are actually the same as that of the first and second active regions 640_1 and 640_2 in the horizontal direction.

The first impurities-doped regions 680a_1 and 680a_2 and the second impurities-doped regions 680b_1 and 680b_2 may be formed along both the edges of the first and second active regions 640_1 and 640_2. The first impurities-doped regions 680a_1 and 680a_2 and the second impurities-doped regions 680b_1 and 680b_2 may be formed by doping impurities along side walls of the first and second active regions 640_1 and 640_2 at relatively low tilt angles by using relatively low energy. In FIG. 6, reference numerals 690, 692, 694, and 696 denote a path in which impurities are doped along surfaces of the relatively wide walls of the first and second active regions 640_1 and 640_2 at relatively low tile angles.

If impurities are doped in the path 690, 692, 694, and 696, the first impurities-doped regions 680a_1 and 680a_2 and the second impurities-doped regions 680b_1 and 680b 2 may taper from top to bottom. Also, the density of impurities in the first impurities-doped regions 680a_1 and 680a_2 and the second impurities-doped regions 680b_1 and 680b 2 may not be the same in the vertical direction. The ratio of a maximum density of impurities to a minimum density of impurities in the vertical direction may be less than or equal to about 10:1.

Figure 7:
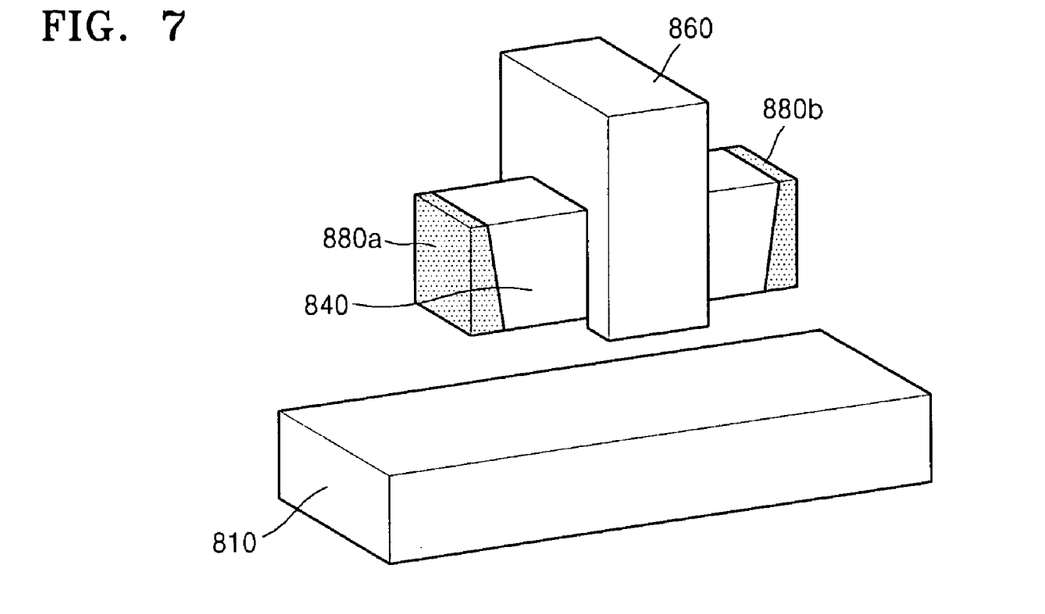
FIGS. 7 to 9 are perspective views of a semiconductor apparatus according to example embodiments.
Figure 8:
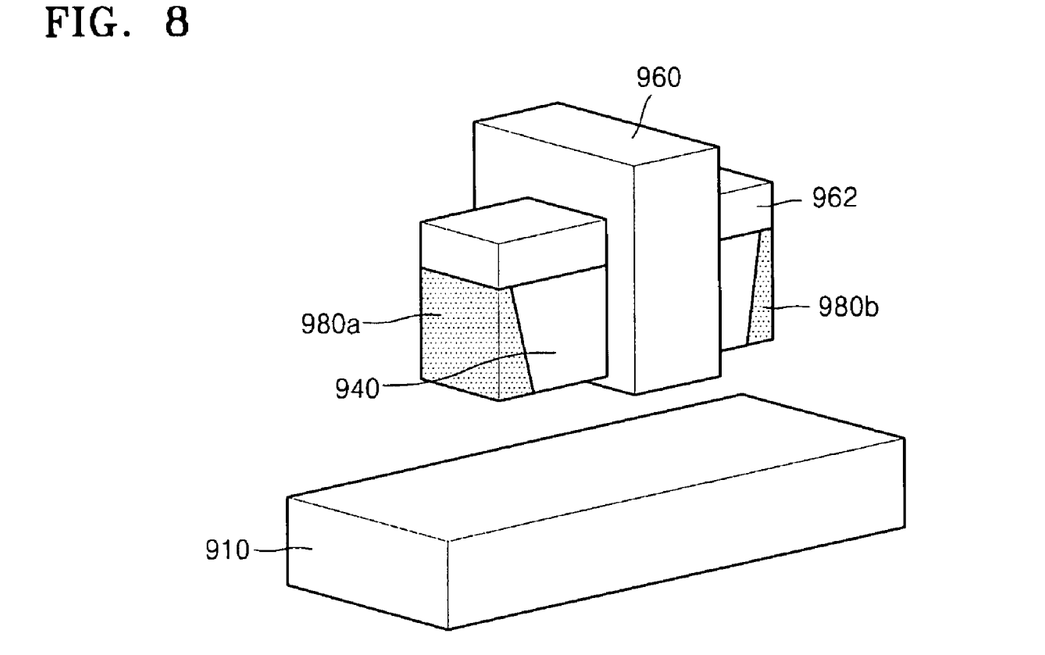
Figure 9:
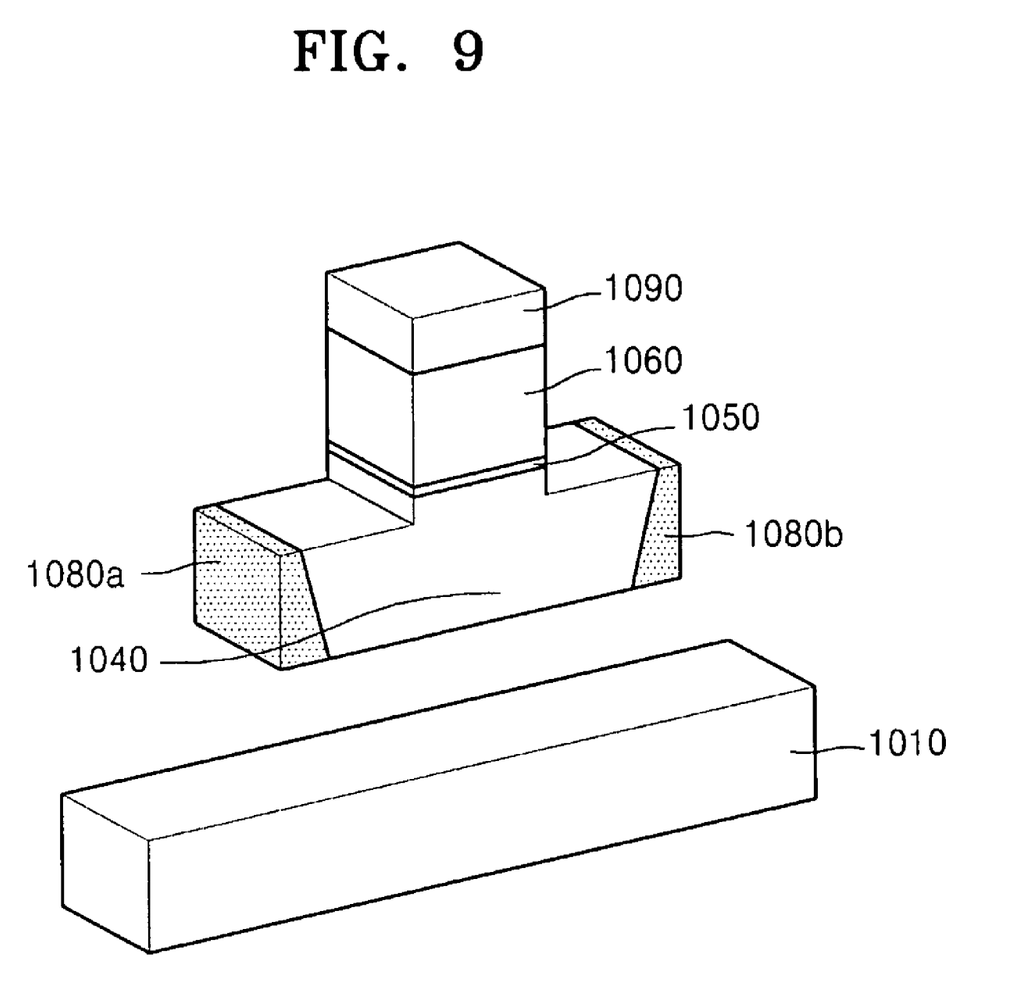

FIGS. 7 to 9 are perspective views of a semiconductor apparatus according to example embodiments. The semiconductor apparatus illustrated in FIG. 1 has a single gate structure, but the single gate structure may be replaced with another gate structure. For example, FIG. 7 illustrates a semiconductor apparatus having a triple gate structure. In the semiconductor apparatus of FIG. 7, a substrate region 810, an active region 840, first and second impurities-doped regions 880a and 880b, and gate pattern 860 correspond to the substrate region 110, the active region 120, the first and second impurities-doped regions 1800a and 180b, and the gate pattern 160 of FIG. 1, respectively, and thus, a detailed description thereof will not be provided here.

FIG. 8 illustrates a semiconductor apparatus having a double gate structure. In the semiconductor apparatus of FIG. 8, a substrate region 910, an active region 940, first and second impurities-doped regions 980a and 980b and gate pattern 960 correspond to the substrate region 110, the active region 120, the first and second impurities-doped regions 180a and 180b and the gate pattern 160 of FIG. 1, respectively, and thus, a detailed description thereof will not be provided here.

FIG. 9 illustrates a semiconductor apparatus having a recessed gate structure. In the semiconductor apparatus of FIG. 9, a substrate region 1010, an active region 1040, first and second impurities-doped regions 1080a and 1080b and gate pattern 1060 correspond to the substrate region 110, the active region 120, the first and second impurities-doped regions 180a and 180b and the gate pattern 160 of FIG. 1, and thus, a detailed description thereof will not be provided here.

While example embodiments have been particularly shown and described with reference to example embodiments thereof, it will be understood that various changes in form and details may be made therein without departing from the spirit and scope of the following claims.

What is claimed is:

1. A semiconductor apparatus comprising:
   a substrate region;
   an active region on the substrate region;
   a gate pattern on the active region; and
   first and second impurities-doped regions along both edges of the active region that do not overlap the gate pattern,
   wherein the length of the first and second impurities-doped regions in the horizontal direction is shorter than in the vertical direction.

2. The semiconductor apparatus of claim 1, wherein the first and second impurities-doped regions increase in width from top to bottom.

3. The semiconductor apparatus of claim 1, wherein the density of impurities is the same in the first and second impurities-doped regions in the vertical direction.

4. The semiconductor apparatus of claim 3, wherein a ratio of a maximum density of impurities to a minimum density of impurities in the vertical direction is less than or equal to about 10:1.

5. The semiconductor apparatus of claim 1, wherein the distance between the first and second impurities-doped regions is equal to or greater than about 2.0 F.

6. The semiconductor apparatus of claim 1, wherein the semiconductor apparatus is one of a single gate structure, a double gate structure, a triple gate structure, and a recessed gate structure.

7. The semiconductor apparatus of claim 1, further comprising:
   an insulation region between the substrate region and the active region and first and second impurities-doped regions; and
   an inter-layer dielectric (ILD) layer surrounding the gate pattern.

8. A semiconductor apparatus comprising:
   a substrate region;
   an active region on the substrate region; and
   first and second impurities-doped regions along both edges of the active region, wherein the first and second impurities-doped regions are narrow along both of the edges of the active region and the length of the first and second impurities-doped regions in the horizontal direction is shorter than in the vertical direction.

9. The semiconductor apparatus of claim 8, further comprising:
an insulation region between the substrate region and the active region and first and second impurities-doped regions;
a gate pattern on the active region; and
an inter-layer dielectric (ILD) layer surrounding the gate pattern.

10. The semiconductor apparatus of claim 9, wherein the first and second impurities-doped regions do not overlap the gate pattern.

11. The semiconductor apparatus of claim 8, wherein the semiconductor apparatus is one of a single gate structure, a double gate structure, a triple gate structure, and a recessed gate structure.

12. The semiconductor apparatus of claim 8, wherein the first and second impurities-doped regions increase in width from top to bottom.

13. A semiconductor apparatus comprising:
a substrate region;
a plurality of active regions on the substrate region and spaced a given distance from each other; and
a plurality of first impurities-doped regions and a plurality of second impurities-doped regions along both edges of the plurality of active regions, respectively,
wherein the plurality of the first and second impurities-doped regions are narrow along both of the edges of the plurality of active regions, and the length of the plurality of the first and second impurities-doped regions in the horizontal direction is shorter than in the vertical direction.

14. The semiconductor apparatus of claim 13, further comprising:
a plurality of gate patterns on the plurality of active regions, wherein the length of the plurality of gate patterns in the horizontal direction is shorter than the length of the plurality of active regions in the horizontal direction.

15. The semiconductor apparatus of claim 14, further comprising:
an insulation region between the substrate region and the plurality of active regions and the plurality of the first and second impurities-doped regions; and
a plurality of inter-layer dielectric (ILD) layers surrounding the plurality of gate patterns.

16. The semiconductor apparatus of claim 14, wherein the plurality of the first and second impurities-doped regions do not overlap the plurality of gate patterns.

17. The semiconductor apparatus of claim 13, wherein the semiconductor apparatus is one of a single gate structure, a double gate structure, a triple gate structure, and a recessed gate structure.

18. The semiconductor apparatus of claim 13, wherein the plurality of first and second impurities-doped regions increase in width from top to bottom.

* * * * *